United States Patent [19]

Argentini

[11] Patent Number: 4,711,859
[45] Date of Patent: Dec. 8, 1987

[54] METHOD FOR FORMING AN INSULATOR HAVING A CONDUCTIVE SURFACE

[75] Inventor: Dino E. Argentini, Danvers, Mass.

[73] Assignee: Raytheon Company, Lexington, Mass.

[21] Appl. No.: 614,097

[22] Filed: May 24, 1984

[51] Int. Cl.$^4$ .......................................... H01L 23/02
[52] U.S. Cl. .................................... 437/209; 437/215
[58] Field of Search ................... 29/589, 590; 118/504, 118/505; 357/74, 81, 15; 427/58, 282

[56] References Cited

U.S. PATENT DOCUMENTS

| | | | |
|---|---|---|---|
| 2,739,911 | 3/1956 | Andriulis et al. | 118/505 X |
| 3,936,864 | 2/1976 | Benjamin | 357/81 X |
| 4,160,992 | 7/1979 | Alderstein | 357/15 X |
| 4,322,277 | 3/1982 | Opresko | 118/505 X |

Primary Examiner—Brian E. Hearn
Assistant Examiner—Kevin McAndrews
Attorney, Agent, or Firm—Denis G. Maloney; Richard M. Sharkansky

[57] ABSTRACT

A pair of conductive surfaces are provided on opposing surfaces of a vitreous or devitrified apertured insulator. A sheet of lead is prepared by electroplating gold on all surfaces thereof, and the insulators are pressed into a surface of the lead mask so that only a first one of the upper and lower surfaces of the member is exposed on said mask surface. A requisite conductive material is then provided on the exposed first one of the upper and lower surfaces of the insulating member and on said adjacent surface of the mask. The gold layer on the back surface of the mask is scraped away and the lead mask is then immersed in a solution which dissolves the lead. The freed insulators are then recovered and cleaned and the second one of the pair of conductive surfaces is applied to the second one of the upper and lower opposing surfaces of the insulator in a similar manner.

9 Claims, 6 Drawing Figures

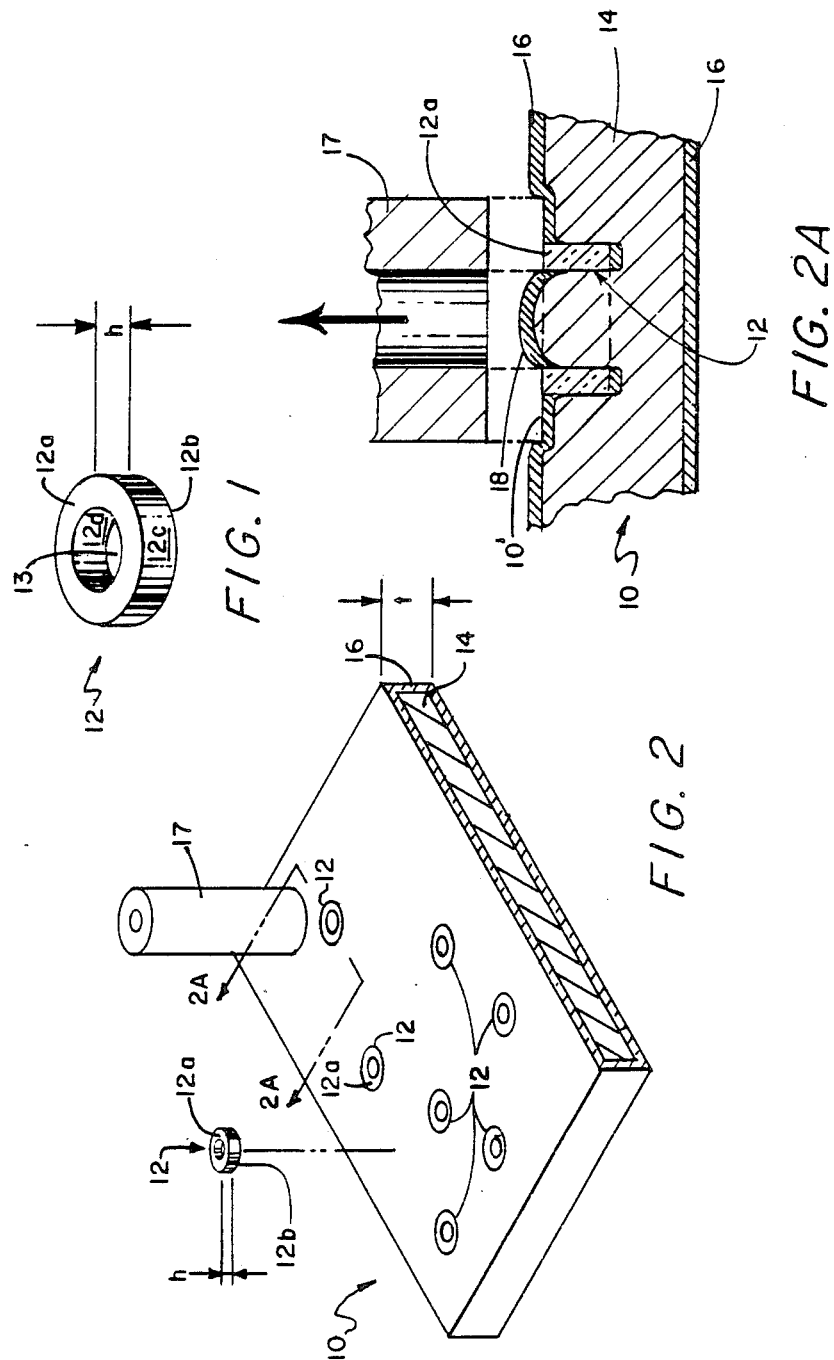

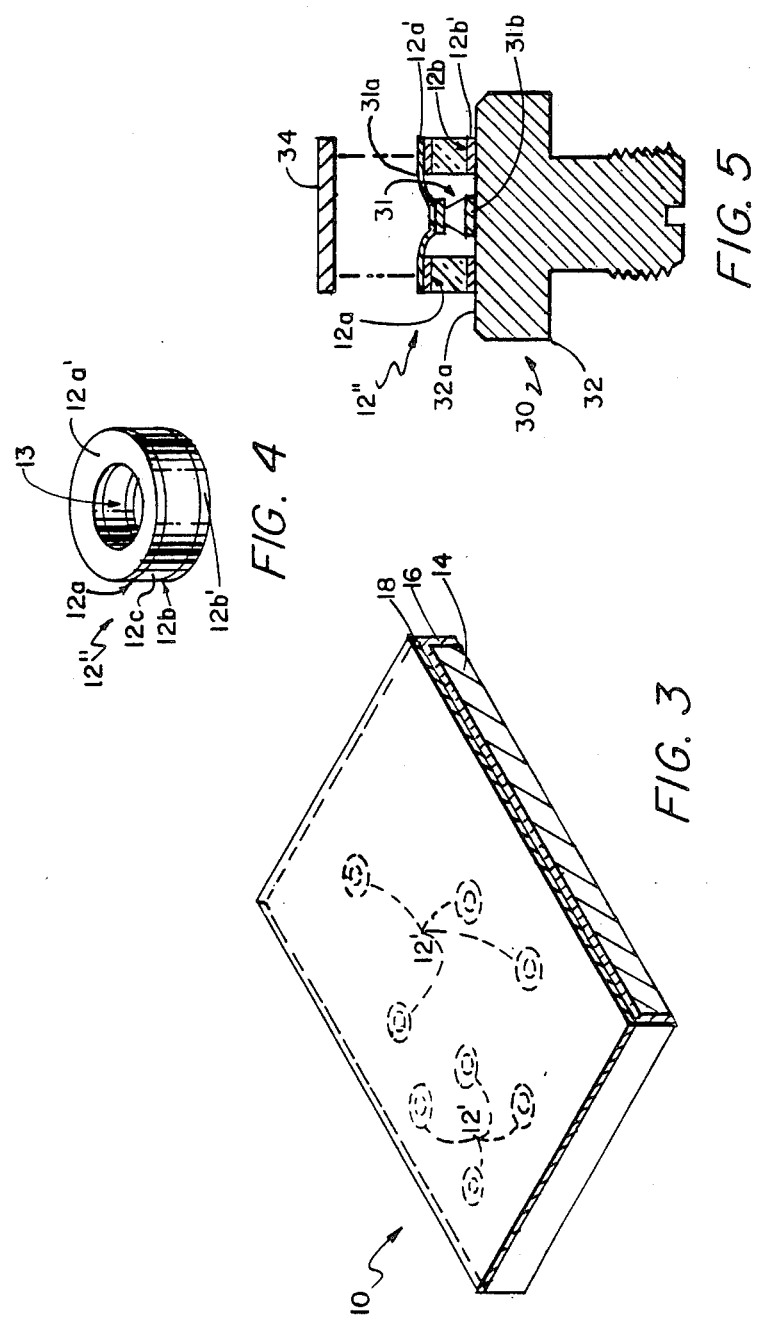

METHOD FOR FORMING AN INSULATOR HAVING A CONDUCTIVE SURFACE

The Government has rights in this invention pursuant to Contract No. F33615-81-C-1470 awarded by the Department of the Air Force.

BACKGROUND OF THE INVENTION

This invention relates generally to semiconductor devices and more particularly to insulating spacers and methods of forming such spacers for use in packaging semiconductor devices.

As is known in the art, a thermally and electrically conductive package for housing a semiconductor device often includes an insulating spacer member to electrically separate a pair of electrical contacts of the semiconductor device. In a package, for example, for an IMPATT diode which has upper and lower electrical contacts, an insulating spacer member having a centrally disposed aperture and a conductive layer provided on upper and lower opposing surfaces thereof, is generally used to maintain the electrical separation between the upper and lower contacts of the IMPATT diode. The IMPATT diode is generally disposed within the aperture provided in the insulating member, with the upper and lower conductive surfaces of the insulating member providing bonding surfaces to the diode and package. The bottom contact of the IMPATT diode and the bottom conductive surface of the insulating member are each bonded to the conductive package, and the upper contact of the IMPATT diode is bonded to the upper surface of the insulating member. The conductive layers on the upper and lower surfaces of the insulating member are generally required to provide adequate thermal and electrical conductivity to the upper and lower electrical contacts of the diode. This upper layer of the insulating member is also used as a bonding surface to attach a cover over the packaged semiconductor device. The problem with fabricating such insulating members having these upper and lower conductive surfaces is that such members tend to be very small in size, typically having a diameter less than one millimeter. As noted above, the upper and lower surfaces of the insulating members must be electrically isolated one from the other, that is, sidewall portions of the conductive member must be free of traces of the conductive layer in order to prevent a short circuit between the electrical contacts of the semiconductor device. Due to the relatively small size of these insulating members, it is generally difficult to form conductive material on the upper and lower surfaces of the insulating members without also forming some conductive material along a portion of the sidewalls of the insulating members.

SUMMARY OF THE INVENTION

In accordance with the present invention, a method for forming a conductive layer on a first surface on an insulator member includes the steps of: providing a conformable material; depressing the insulator member into said conformable material; masking sidewall portions of the insulating member while leaving the first surface of the insulator member unmasked; depositing a conductive material onto the first surface of the insulating member; and removing the insulating member having the conductive layer from the mask. With such an arrangement, the conductive material is provided only on the exposed surface of the insulating member while the masked portions of the insulating member are protected from the conductive material. This method may be repeated to provide a conductive layer on the second surface of the insulating member, thus providing an insulating member having a pair of electrically isolated conductive surfaces.

In accordance with a preferred embodiment of the invention, the mask is comprised of a relatively soft metal, such as lead, which is electroplated with a protective layer, such as gold. The insulator is impressed into the lead mask so that the top surface is exposed, the bottom and side surfaces being masked by the lead mask. The lead mask is mounted on a copper heat sink and a suitable metallization is sputtered on. With this arrangement by using the lead mask having the protective layer thereon, the protective layer serves to prevent contamination by the lead during the sputtering process. The protective layer is then scraped away or removed after the sputtering process and the lead mask is then dissolved away by immersing it in a solution of 50% hydrogen peroxide and 50% glacial acetate acid. When the lead has been dissolved, the insulators are recovered, rinsed and cleaned. The method is then repeated using a new mask for the second surface of the insulator to provide a pair of electrically isolated, conductive surfaces on the upper and lower opposing surfaces of the insulator.

BRIEF DESCRIPTION OF THE DRAWINGS

The foregoing features of this invention, as well as the invention itself, may be more fully understood from the following detailed description of the drawings, in which:

FIG. 1 is an isometric view of a cylindrical shaped insulating member having opposing upper and lower nonconducting surfaces;

FIGS. 2 and 3 are isometric views showing the steps in providing the insulating member of FIG. 1 with a conductive surface on a first one of upper and lower surfaces thereof by using a lead mask in accordance with the present invention;

FIG. 2A is an exploded cross-sectional view of FIG. 2 taken along line 2A—2A showing in some detail the insulating member impressed into the mask by a jewelling tool, as the jewelling tool is being removed;

FIG. 4 is an enlarged isometric view of an insulating member having upper and lower conductive surfaces in accordance with the present invention; and FIG. 5 is a cross-sectional view of a packaged semiconductor device showing such device mounted between the upper and lower surfaces of the insulating member of FIG. 3.

DESCRIPTION OF THE PREFERRED EMBODIMENT

Referring now to FIG. 1, a commercially available spacer member 12, here an insulating member having a cylindrical shape and having an aperture 13 centrally disposed therethrough and being comprised of a vitreous or devitrified material, such as sapphire, diamond or ceramic, is shown to include an upper surface 12a, a lower surface 12b, an outer sidewall portion 12c and an inner sidewall portion 12d.

Fabrication of a member 12'' (FIG. 4) having upper and lower conductive surfaces 12a', 12b' (FIG. 4) from the member 12 of FIG. 1 will now be described in conjunction with FIGS. 2, 2A and 3.

Referring first to FIGS. 2, 2A, a mask 10 is shown to include a sheet 14, here of lead having a thickness of 1/16" which has been provided with a protective layer 16, here an electroplated layer of gold, here having a thickness of 75 $\mu$ inches. Members 12, as described in conjunction with FIG. 1, are impressed into the mask 10 such that sidewall portions 12c, 12d and a first one of the upper 12a and lower 12b surface portions of the member 12 are masked and the remaining one of upper 12a and lower 12b surface portions are exposed on the surface of the mask 10 (FIG. 2A). Preferably, said exposed surface of member 12, here in FIG. 2, surface 12a, is substantially flush with the surface 10' of the mask 10. The members 12 are pressed into the mask 10 by any convenient means. A jewelling tool 17 which is often used to impress jewels into a watch movement, for example, is here used. As shown in FIG. 2A, the member 12 is impressed into the sheet such that surface 12a is exposed while surfaces 12b, 12c and 12d are masked. The mask 10 conforms to the shape of the member 12 and further pushes up and forms a bubble 18 through the aperture 13 to mask or cover the lower surface 12b, outer sidewall 12c and inner sidewall 12d.

Referring now to FIG. 3, after the requisite number the members 12 have been impressed within the surface of mask 10, a thin, here composite metallization layer 18 is deposited over the mask layer 10 and exposed surfaces 12a, thus providing members 12'. One method to deposit the layer 18 is by sputtering. The mask 10 is here placed on a suitable thermally and electrically conductive heat sink and said mask and heat sink are disposed within a sputtering apparatus (not shown) and a conductive layer or as here a composite conductive layer 18 comprising titanium, platinum and gold is then sputtered upon the exposed first surface 12a of the members 12 (FIG. 1). The heat sink is required to cool the mask and thus prevent the mask 10 from dissolving during the sputtering process. The protection layer 16 is here used to prevent contamination of the sputtering apparatus by the lead 14. After the thin composite layer 18 is provided, the mask 10 is removed from the apparatus and a portion of the protective layer 16 on the back side of the mask 10 is scraped away or removed, exposing the underlying lead sheet 14. The mask 10 is then immersed in a solution, here a solution of 50% hydrogen peroxide and 50% glacial acetate acid to dissolve the lead sheet 14, thus freeing, separating or demounting the individual members 12' having a conductive layer 12a' on here the upper surface 12a. The solution acts as a selective dissolvent which dissolves the material of layer 14, here the lead, but which is inert to the materials of the composite layer 18. The protective layer 16, if not dissolved by the dissolvent, as is the case here, since protective layer 16 is comprised of gold, and gold is one of the sputtered layers of composite layer 18, will nevertheless float away from and free of the members 12' having thereon the conductive layer 12a'. Since after dissolving masking layer 14, the protective layer 16 is supported only by the thin composite layer 18. This arrangement permits members 12' to breakaway from the protective layer 16, without disrupting the conductive surface 12a' provided on such members 12'. The free members 12' are then recovered, rinsed and cleaned. The entire process may be repeated for a second time by impressing such members 12' with the now metallized surface 12a into a different mask to provide the second or lower surface 12b of the member with the conductive layer to thus provide the member 12", as shown in FIG. 4. Any small flakes of layer 16 or layer 18 which may be present, overhanging from the conductive surfaces of member 12' or member 12" may be removed by any light abrasive process. For example, placing members 12' or 12" into a vessel (not shown) with some of the members 12 (FIG. 1) and agitating them briefly will remove any of such flakes.

The mask 10 has a thickness "t" selected to be substantially larger than the overall height "h" of the member 12 such that when the member 12 is impressed into the mask, only a first one of the upper and lower surfaces 12a, 12b of the member 12 is exposed. Similarly, the material of the mask 10 is selected to be a relatively soft material compared to the hardness of members 12 such that the members 12 can be relatively easily impressed within the material. The material of the mask 10 is also selected such that the material of the mask may be conveniently dissolved, thereby freeing the members 12 from the mask 10 while at the same time, leaving intact the conductive layers 12a', 12b' provided on the upper and lower surfaces 12a, 12b.

Referring now to FIG. 5, a packaged semiconductor device 30, here including an IMPATT diode 31, is shown to further include the member 12" (FIG. 4) having the pair of conductive surfaces 12a', 12b'. The package device 30 also includes a thermally and electrically conductive pedestal member 32 having an upper surface 32a upon which is disposed the IMPATT diode 31 and the member 12'. A bottom contact 31b of the IMPATT diode 31 and the bottom conductive surface 12b' of the member 12" are bonded to the upper surface 32a of the pedestal member 32. A beam lead electrode pattern 31a of the diode 31 is bonded to the upper conductive surface 12a' of the member 12". A conductive lid 34 is then bonded over the upper surface 12a' of the member 12" to provide the packaged semiconductor device 30. Having described a preferred embodiment of the invention, it will now be apparent to one of skill in the art that other embodiments incorporating its concept may be used. It is felt, therefore, that this invention should not be limited to the disclosed embodiment, but rather should be limited only by the spirit and scope of the appended claims.

What is claimed is:

1. A method of providing a conductive layer on a first one of a pair of opposing surfaces of a spacer member comprising the steps of:

masking the second one of the pair of opposing surfaces and sidewall surfaces of the member with a conformable masking material while leaving the first one of the pair of opposing surfaces exposed; and providing the conductive layer on the exposed, first opposing surface of the member.

2. A method of forming a conductive surface on an insulating member comprising the steps of:

providing a conformable material;

impressing the insulating member into the material leaving a surface of the insulating member exposed; and providing a conductive layer over the material and exposed portion of the insulating member.

3. The method as recited in claim 2 wherein the insulating member has an aperture and during the step of impressing, portions of the conformable material bubble up through the aperture of the member, masking inner sidewall portions of the member.

4. The method as recited in claim 2 wherein the step of providing the conductive layer includes the step of sputtering a conductive layer over the exposed portion of the insulating member.

5. The method as recited in claim 2 further comprising the step of dissolving away the conformable material.

6. A method of providing a conductive surface on a first one of a pair of opposing surfaces of an insulating spacer member comprising the steps of:
 providing a sheet comprising lead having a layer of a protective material on surface portions thereof;
 pressing the insulating member into the protective layer and sheet of lead leaving the first one of the pair of opposing surfaces of the insulating member exposed on the surface of the lead sheet; and
 providing a layer of conductive material on the first opposing surface of the insulating member.

7. A method of packaging a semiconductor device comprising the steps of:
 (a) providing a thermally and electrically conductive support having a first surface;
 (b) providing a pair of conductive surfaces on a pair of opposing surfaces of an insulating member having an aperture comprising the steps of:
  (i) masking a first one of the pair of opposing surfaces and inner and outer sidewall surface portions of the member with a conformable masking
  (ii) providing a conductive layer on the second one of the pair of surfaces;
  (iii) removing the member from the mask;
  (iv) masking the second surface having the conductive layer and said inner and outer sidewall portions with a conformable masking material;
  (v) providing a conductive layer on the first one of the pair of surfaces; and
  (vi) removing the insulating members having the pair of opposing surfaces;
 (c) inserting the semiconductor device through the aperture of the insulating member;
 (d) bonding one of the pair of conductive surfaces of the insulating member and a first one of a pair of contacts of the semiconductor device to the first surface of the support and the second one of the pair of contacts of the semiconductor device to the second one of the conductive surfaces of the insulating member.

8. A method of providing a conductive layer on a first one of a pair of opposing surfaces of a spacer member having an aperture comprising the steps of:
 masking the second one of the pair of opposing surfaces and inner and outer sidewall surfaces of the member with a conformable masking material while leaving the first one of the pair of opposing surfaces exposed; and
 providing the conductive layer on the exposed, first opposing surface of the member.

9. A method of packaging a semiconductor device comprising the steps of:
 (a) providing a thermally and electrically conductive support having a first surface;
 (b) providing a pair of conductive surfaces on a pair of opposing surfaces of an insulating member having an aperture comprising the steps of:
  (i) impressing the member into a first mask comprising a conformable material, said material masking a first one of a pair of opposing surfaces of the member and inner and outer sidewall surfaces of the member;
  (ii) providing a conductive layer on the second one of the pair of surfaces;
  (iii) removing the member from the mask;
  (iv) impressing the member into a second mask comprising a conformable material, said material masking the second one of the pair of opposing surfaces of the member and the inner and outer sidewall surfaces of the member;
  (v) providing a conductive layer on the first one of the pair of surfaces; and
  (vi) removing the member having the pair of opposing conductive layer surfaces;
 (c) inserting the semiconductor device through the aperture of the insulating member;
 (d) bonding one of the pair of conductive surfaces of the insulating member and a first one of the pair of contacts of the semiconductor device to the first conductive surface of the support and the second one of the pair of contacts of the semiconductor device to the second one of the conductive surfaces of the insulating member.

* * * * *